US005757090A

United States Patent [19]

Kirjavainen

[11] Patent Number: 5,757,090

[45] Date of Patent: May 26, 1998

[54] FOLDED DIELECTRIC FILM ELEMENT AND METHOD FOR MAUFACTURING THE SAME

[76] Inventor: Kari Kirjavainen, Kivenlahdenkatu 11 A 4, Fin-02320, Espoo, Finland

[21] Appl. No.: 564,035

[22] PCT Filed: Jun. 21, 1994

[86] PCT No.: PCT/FI94/00278

§ 371 Date: Mar. 11, 1996

§ 102(e) Date: Mar. 11, 1996

[87] PCT Pub. No.: WO95/01079

PCT Pub. Date: Jan. 5, 1995

[30] Foreign Application Priority Data

Jun. 21, 1993 [FI] Finland .................................... 932860

[51] Int. Cl.$^6$ ...................................................... G11C 13/02

[52] U.S. Cl. .......................... 307/400; 29/592.1; 29/886; 367/170; 381/191

[58] Field of Search ............................... 307/400; 29/592, 29/592.1, 886; 264/436; 367/140, 170; 381/191

[56] References Cited

U.S. PATENT DOCUMENTS

| | | | |
|---|---|---|---|
| 2,855,467 | 10/1958 | Curry | 179/111 |
| 3,008,014 | 11/1961 | Williamson et al. | 179/111 |
| 3,996,922 | 12/1976 | Basham | 128/722 |
| 4,400,634 | 8/1983 | Micheron | 307/400 |
| 4,654,546 | 3/1987 | Kirjavainen | 307/400 |
| 4,725,994 | 2/1988 | Kaneko et al. | 367/140 |
| 5,219,673 | 6/1993 | Kaun | 429/32 |
| 5,395,592 | 3/1995 | Bolleman et al. | 422/128 |

FOREIGN PATENT DOCUMENTS

| | | |
|---|---|---|
| 29 00 611 A1 | 7/1980 | Germany . |
| 212576 | 6/1925 | United Kingdom . |

*Primary Examiner*—William M. Shoop, Jr.
*Assistant Examiner*—Jonathan S. Kaplan
*Attorney, Agent, or Firm*—Kubovcik & Kubovcik

[57] ABSTRACT

A folded dielectric film element is provided which converts energy. The film element includes at least one dielectric film that is bent into folds and provided with electrodes. The electrodes are arranged in the folds so that different electrodes are placed in successive folds. The strength of an electric field increases in one fold and decreases in a successive fold.

10 Claims, 6 Drawing Sheets

FIG.3B
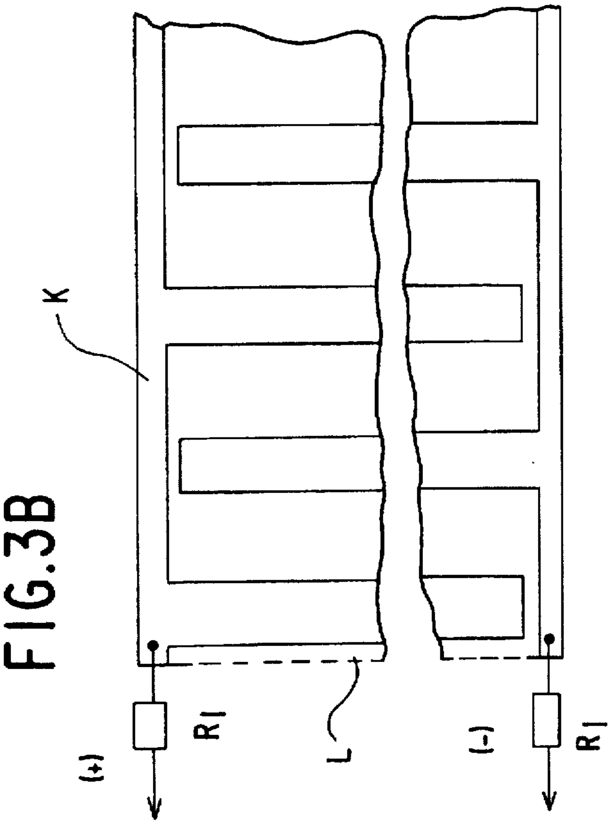
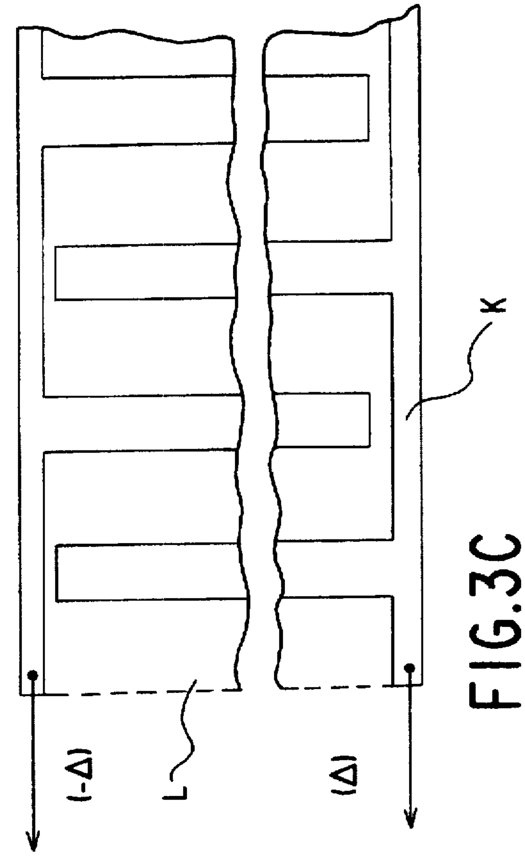
FIG.3C
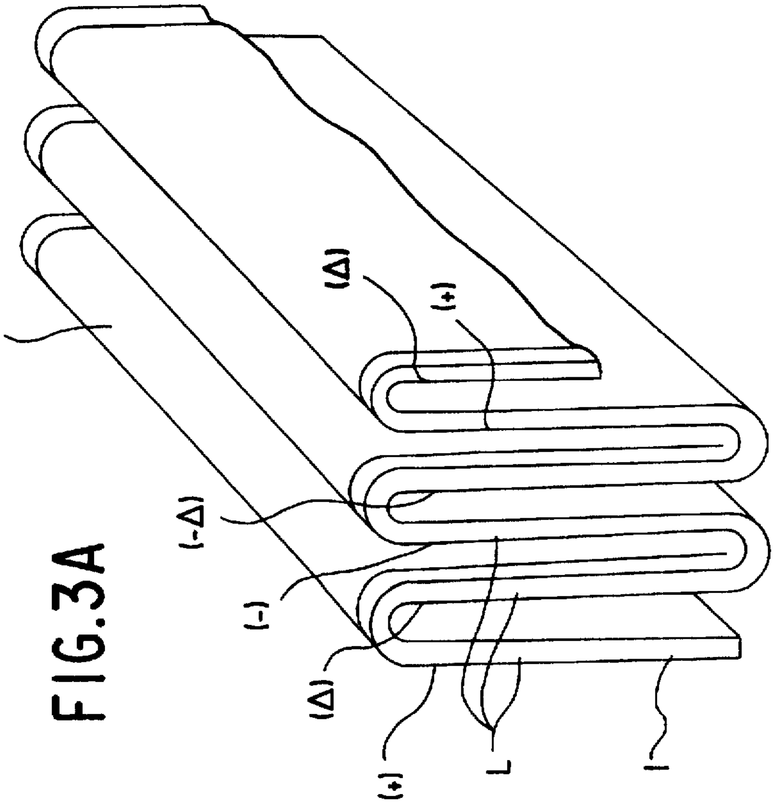
FIG.3A

FIG.7
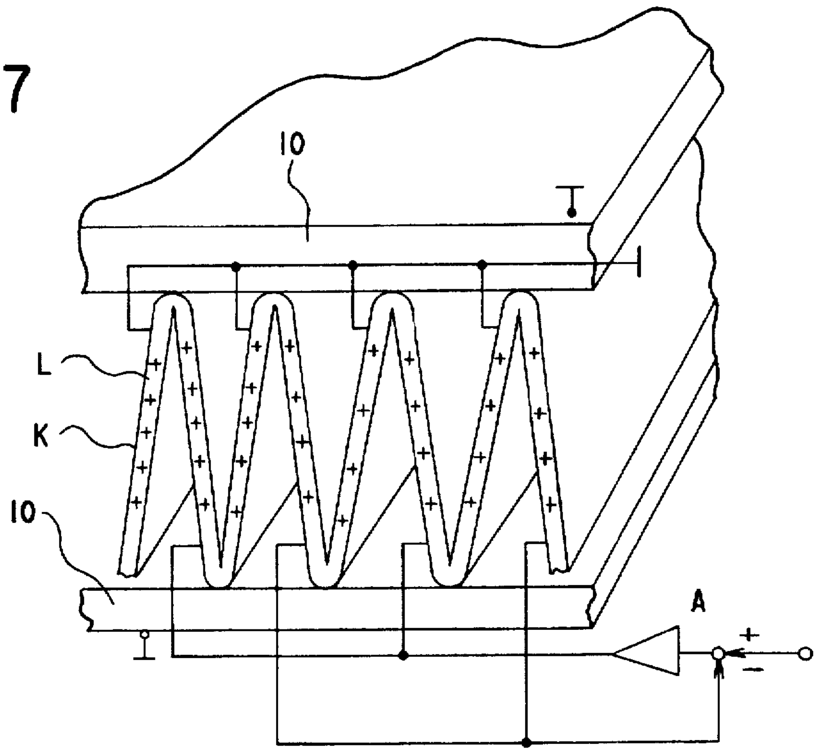
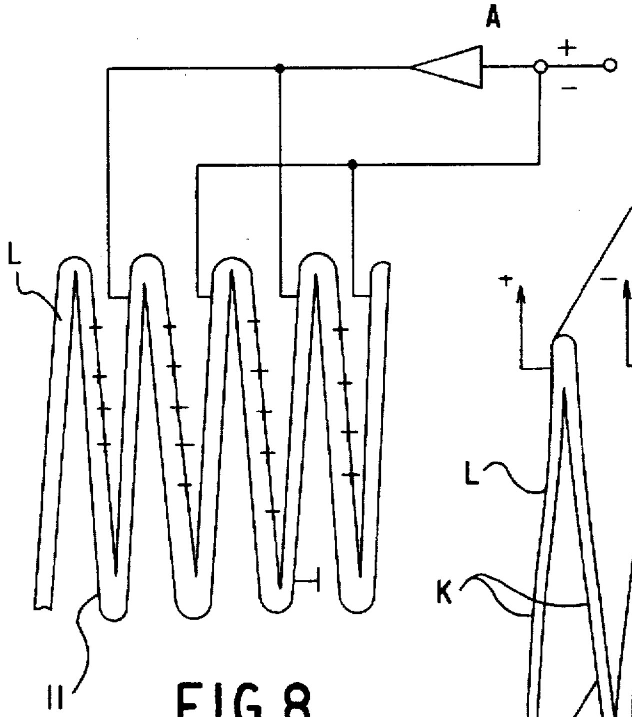
FIG.8
FIG.6
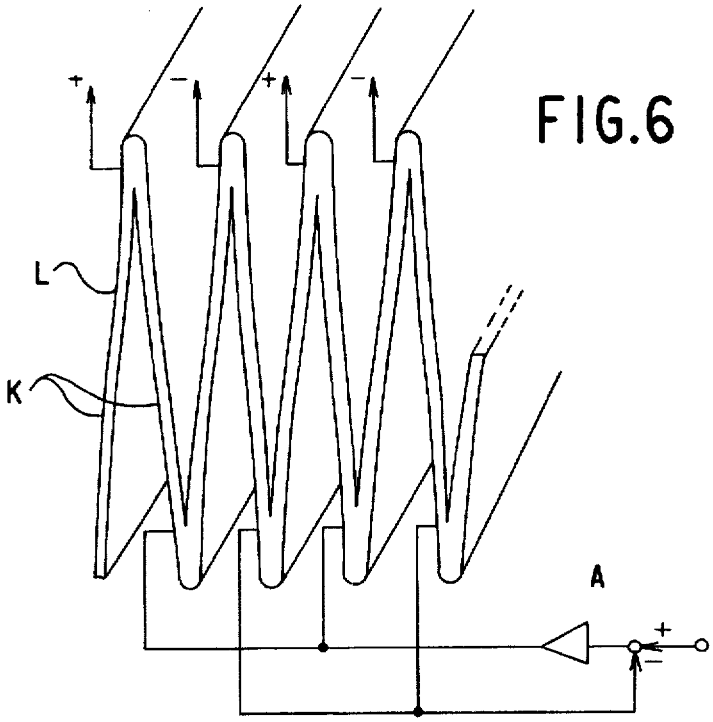

FOLDED DIELECTRIC FILM ELEMENT AND METHOD FOR MAUFACTURING THE SAME

BACKGROUND OF THE INVENTION

The present invention relates to a folded dielectric film element acting as an energy converter and to a procedure for manufacturing such a film element. This type of film can be used for the generation, measurement and damping of sound. Broadly speaking, the invention is concerned with the conversion of electric energy into mechanical energy or conversion of mechanical energy into electric energy. A film like this is presented e.g. in U.S. Pat. No. 4,654,546.

To permit an electric field to be utilized in this type of energy converter, the air gaps used must be very small to achieve a sufficient field strength. However, this means that the play of the converter is reduced.

SUMMARY OF THE INVENTION

The object of the present invention is to produce a new solution for increasing the amount of air or medium replaced by the converter by using a folded dielectric film and placing electrodes in the folds.

The solution of the invention makes it possible to utilize increased air motion amounts while simultaneously producing large air pressures, e.g. sound pressures in acoustic applications.

The invention also concerns a procedure for the manufacture of converter elements, in which a folded element is first compressed into a tight pack, causing the corners of the folds to be pressed into sharp edges. After this, by stretching the element, the folds assume their natural curvature, resembling a low-gradient letter S, which keeps the folds in a stable position when subjected to the forces of the electric field.

Elements manufactured according to the invention allow a high acoustic power to be reached. In noise damping applications, the elements function in a multi-effect manner, damping the noise passively while the air is flowing in the gaps between the folds. The electric energy generated by the sound waves is converted into heat in the resistances of the electrodes. A measured signal corresponding to the sound pressure can be fed in opposite phase to another element. The two first-mentioned priniciples damp sound waves of any frequency coming from any direction, and in the case of low frequencies, also those incident at an oblique angle. The sound damping capacity of the element is 20 dB at best.

BRIEF DESCRIPTION OF THE DRAWINGS

In the following, the invention is described by the aid of an example by referring to the attached drawings, in which

FIGS. 3*a*–3*c* show a third folded dielectric film according to the invention.

FIGS. 6 and 7 present applications of circuits connected according to the invention.

FIG. 8 illustrates an electret film with a metal plating on one side.

DETAILED DESCRIPTION OF THE INVENTION

Figure 1B:
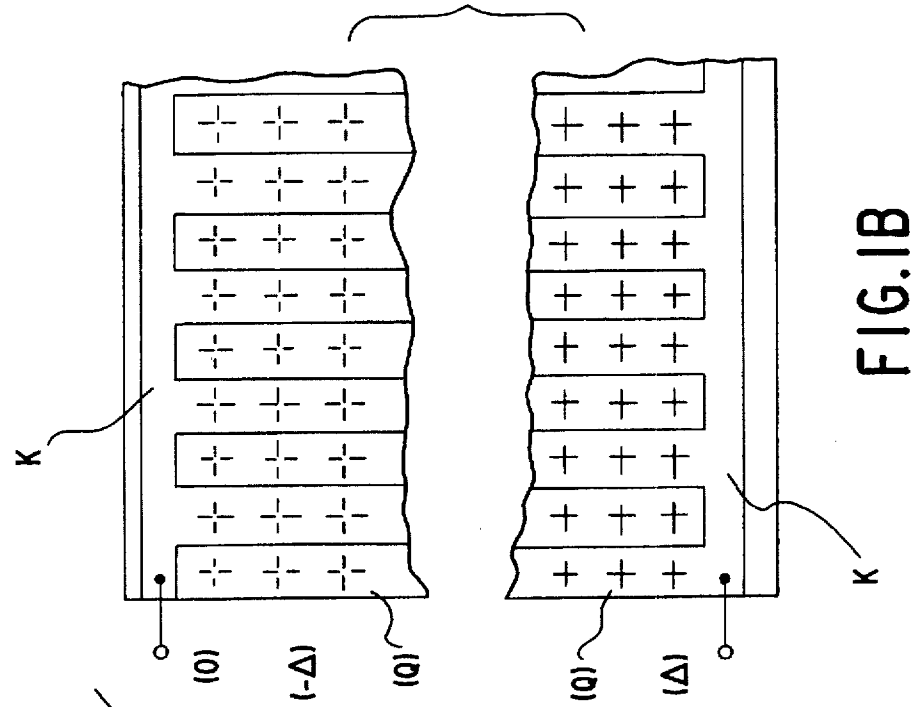
FIGS. 1*a* and 1*b* present a folded dielectric film according to the invention.
Figure 1A:
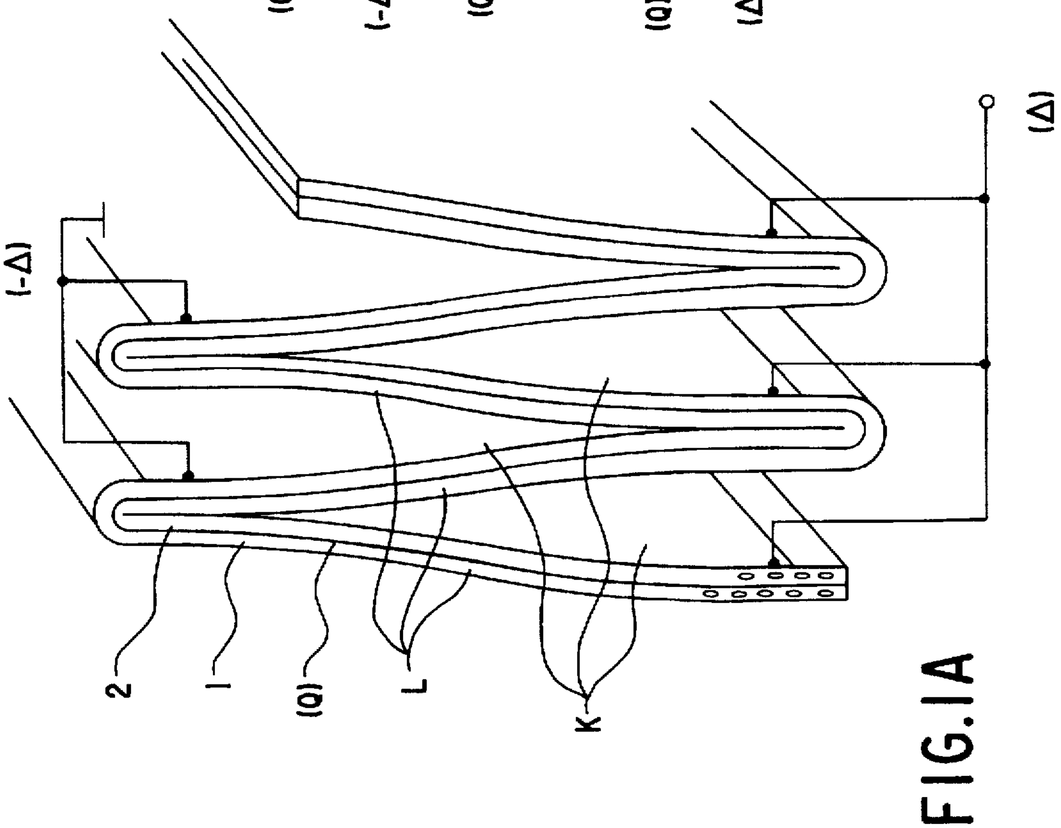

FIG. 1*a* presents an embodiment of the invention, showing a densely folded (folds L) dielectric film element comprised of two film layers 1, 2 placed one upon the other. In FIG. 1, the electric field is alternately strengthened and weakened in successive folds L by means of a control voltage (signal). In the folded element, the film, which is charged to charge Q, is coated in the successive folds with electrode layers K such that control electrodes of opposite polarity are placed on opposite sides of the fold L. Such a film element can be manufactured e.g. from a permanently charged electret film or a three-layer film in which the middle layer consists of semiconducting material connected to a d.c. potential producing a charge Q. A control signal Δ (for example, an a.c. voltage) is applied on one side of the layer K and a control signal −Δ (for example an a.c. voltage) is applied in opposite phase on the opposite side of the layer K. FIG. 1*b* illustrates the structure of the control electrodes K, which is comprised, for example, of an AC voltage electrode (Δ) and an AC voltage electrode (−Δ). Both include a rectangular edge and vertical bars starting from the edge and placed between the bars of an opposite electrode. Each fold L is joined at its ends with an adjacent fold L but is separated from adjacent folds at its middle portion. Such an element can be controlled using traditional amplifier equipment in sound reproduction applications.

Since the pressure which can be achieved by the electrostatic principle is $$p=\frac{1}{2}\epsilon E^2=\frac{1}{2}\epsilon(U/s)^2,$$

where ε is the dielectric constant, E is the strength of the electric field, U is the voltage and s is the distance between the electrodes, it is of essential importance for the achievement of a good linearity that the terms dependent on the distance remain as constant as possible, as is the case in folds L designed according to the invention.

Sound reproduction devices employing the electrostatic principle generally use perforated stator plates and a thin movable electrode film between them. Since the force of the electric field affects the stator plates as well, undesirable resonances are generated in them. Moreover, the elements have to be large to produce a sufficient power.

The sound reproduction device presented in this invention consists of only one folded film structure with electrodes formed on it.

In another embodiment (FIG. 2*a*), the electrodes K are arranged by connecting to the sides of the folds L in successive order a positive potential (for example, a positive d.c. voltage), a positive control signal Δ, (for example, an a.c. voltage applied at a first phase) a negative potential (for example, a negative d.c. voltage) and a control signal −Δ in opposite phase (for example, an a.c. voltage applied at a second phase which is opposite to the first phase). The electrodes K are connected by joining the same kind of electrodes together at the edge of the film. The voltage to the positive and negative electrodes can be connected via large resistances. The positive and negative charges can also be replaced with a so-called electret charge, which is injected into the dielectric film in a cyclic fashion with positive and negative charges alternating to form positive and negative electret charge electrodes. The film of the invention can also be used for the measurement of sound or vibration, i.e. electric energy corresponding to the movement of the electrodes is induced in the Δ and −Δ electrodes.

Figure 2B:
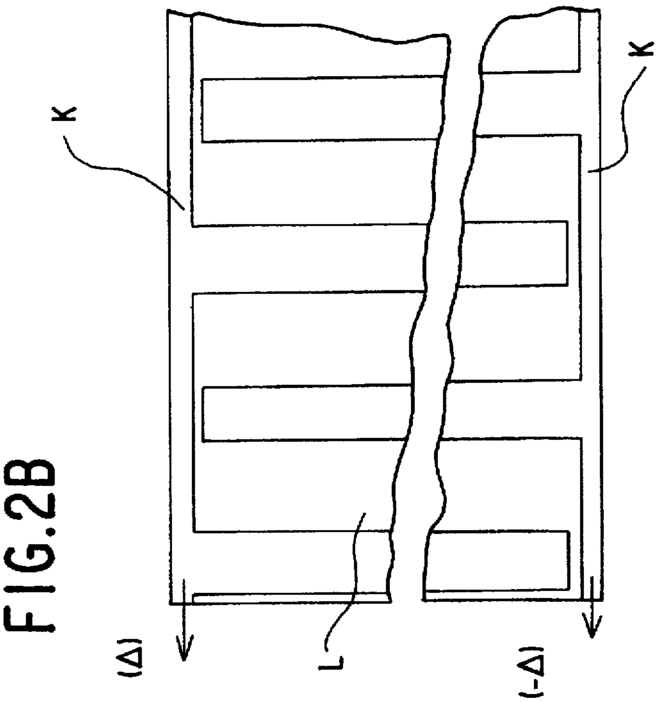
FIGS. 2*a*–2*c* show another folded dielectric film according to the invention.
Figure 2C:
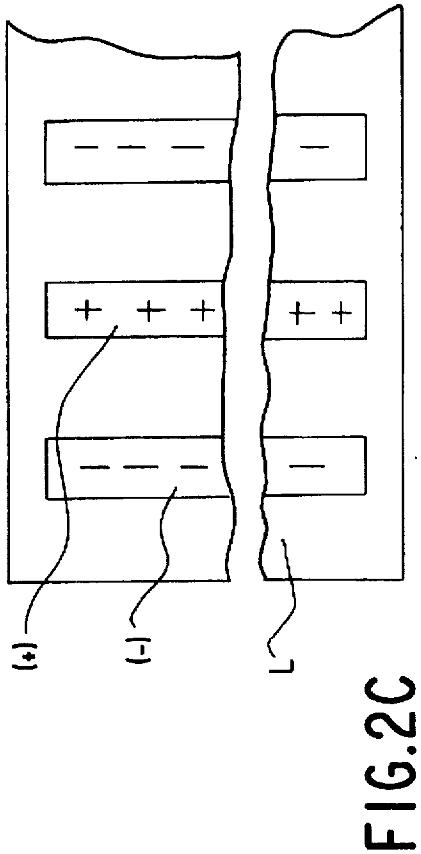
Figure 2A:
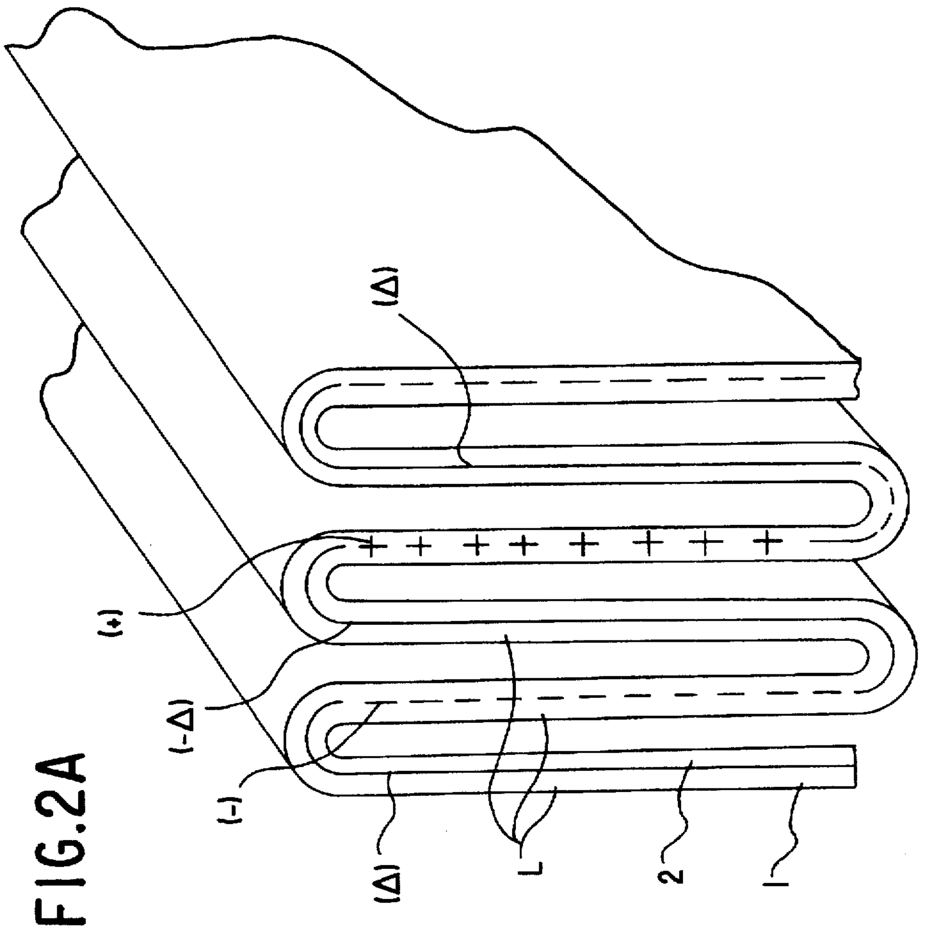
Figure 4B:
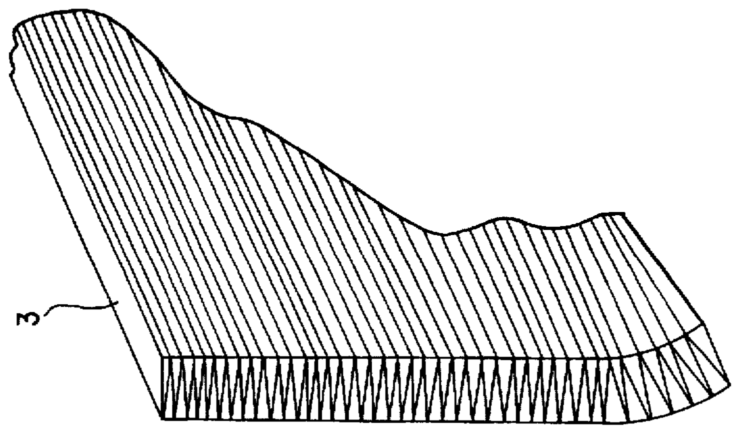
FIG. 4*a* presents a variable-gain amplifier circuit and FIG. 4*b* a curved film.
Figure 4A:
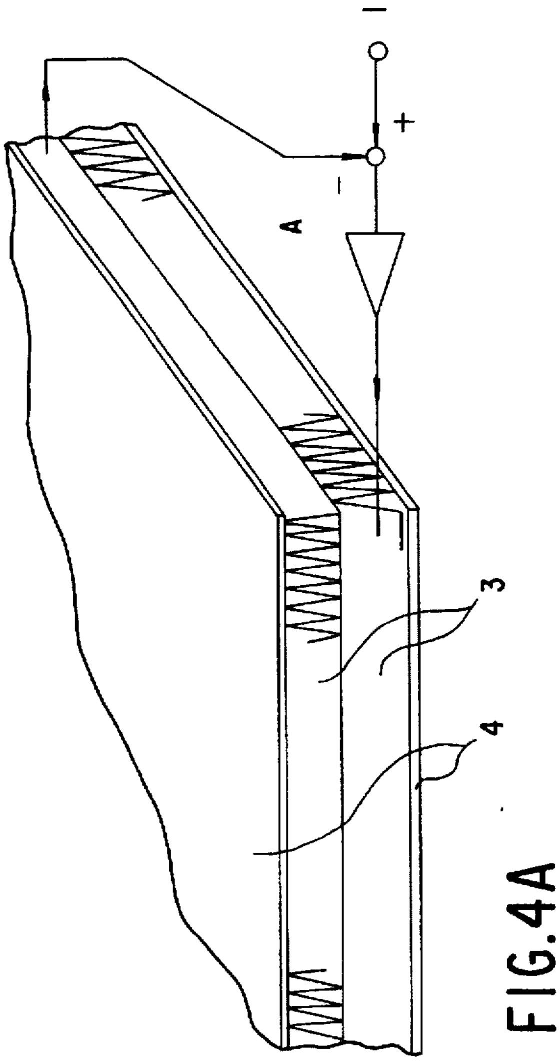

The film element shown in FIG. 1*a* can be manufactured from a thin plastic film with a metal plating on either side, in which the electrodes K are etched by using a technique employed in the manufacture of circuit boards. After this, the film is bent into folds L of a height of e.g. 1–10 mm with a distance of 0.1 mm between them. In the structure presented in FIG. 2*a*, consisting of two films, electret charges are placed between the films. The bars of the electrodes K are spaced at larger intervals and the positive and negative potentials are placed between them (FIGS. 2*b* and 2*c*). FIGS. 4*a* and 4*b* present an embodiment of the invention in which two folded films 3 are placed crosswise, one of which is fed with a reference signal I via a variable-gain amplifier A and the measurement signal obtained from the other film, corresponding to the sound pressure, is fed into the input of the variable-gain amplifier in opposite phase. In addition to sound reproduction applications, this film element can be used as an active damping element when the control signal is set to zero. The element can be coated with protective layers 4, both of which may be e.g. thin films or one may be a thicker plate. It is possible to place several or at least two elements as shown in FIG. 3*a* on top of each other with protective layers 4 on the outermost surfaces. In FIG. 3*b*, the voltage to the positive and negative electrodes is connected via a large resistance R1. As for the electrodes K, FIG. 3*c* corresponds to FIG. 2*b*.

The elements of the invention are very light and durable and have a large power capacity. The films 1, 2 are preferably produced from plastic films containing flat gas bubbles because it has been established that such films retain their electret charge well and are as light as possible. A film of this type is presented in U.S. Pat. No. 4,654,546. In sound source applications, the invention is especially advantageous because the film movement is transverse to the sound direction, which means that the mass inertial forces of the film do not produce a counter moment in the direction of the sound. In noise damping applications, the elements function in a multi-effect manner. The air flowing between the folds L causes a viscose damping, and so does the visco-elastic motion of the films.

By using resistive electrode layers, a phase shift can be created in the element and the directional pattern can be widened only horizontally. To produce different directional patterns, the elements may also have a curved shape (FIG. 4*b*).

The invention can also be utilized in many other applications designed to convert electric energy into mechanical motion or vibration, or conversely to convert mechanical motion or vibration into electric energy. In both cases, a very high efficiency is achieved.

Figure 5A:
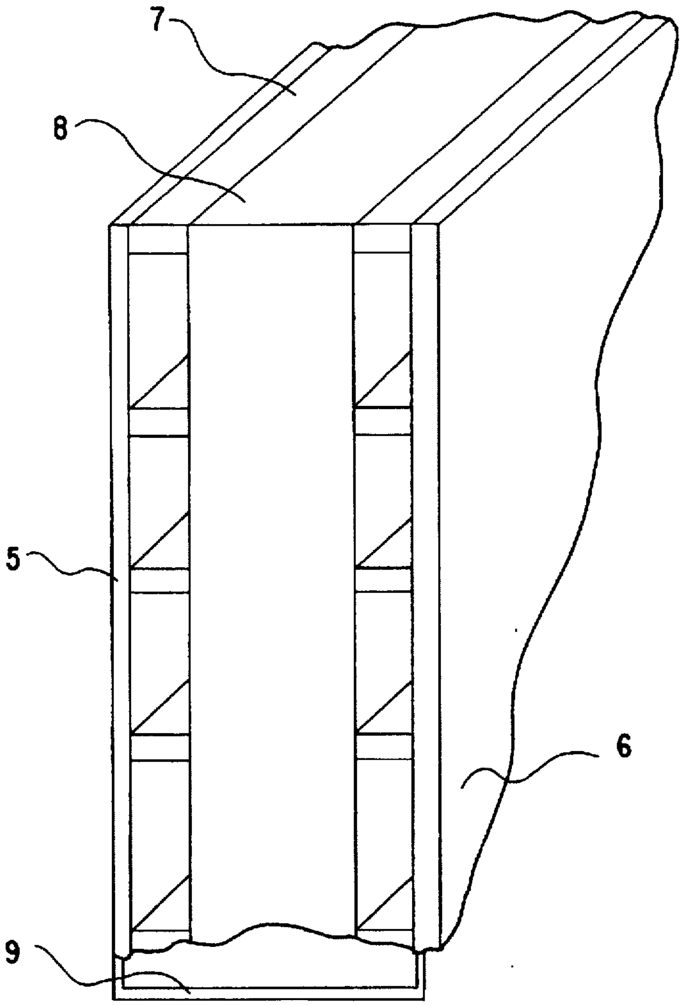
FIGS. 5*a*–5*c* illustrate a wall structure and its damping capacity.
Figure 5B:
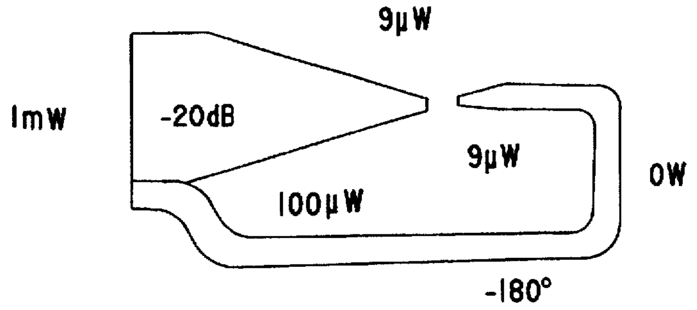
Figure 5C:
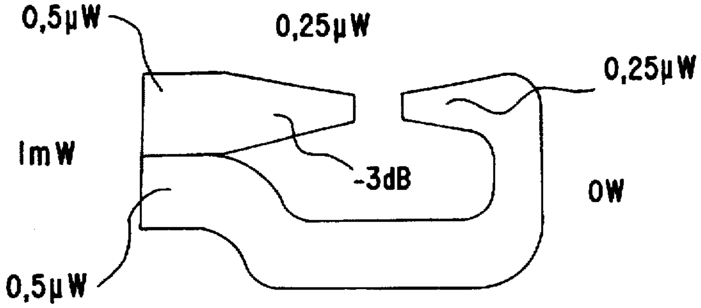

FIGS. 5*a*–5*c* present an application of the invention in which battens 7 are attached to each side of a wall 8 or plate and elements 5 and 6 are placed on the battens, the elements being electrically connected by conductors 9. A noise generates a change of charge in element 5. This is fed in opposite phase into element 6. If the wall has a passive damping of e.g. 20 dB and the elements have an efficiency of 10%, complete damping in both directions is achieved (FIG. 5*b*). The efficiency and damping of the elements can be adjusted by varying the + and – voltages or by selecting a suitable electret potential so as to obtain an optimal efficiency and the best damping for each practical application. Also, the folding density can be varied.

It is also possible to include an inductance or some other type of passive component in the conductor 9 to adjust the frequency and phase shift characteristics between the elements 5, 6. Moreover, the resonance spaces between the battens 7 can be utilized (FIG. 5*c*).

A larger number of elements 5, 6 can be used in an application, and the elements can be interconnected in various ways depending on the use. An active amplifier or filter circuit can also be used. Since the elements 5, 6 have a passive sound damping effect as well and may have a very high efficiency, it is not always necessary to use an intermediate passive damping layer.

FIG. 6 presents an embodiment of the invention in which every third fold L is connected to the output of a controlling amplifier A, whereas every second fold is sound-producing and connected as a feedback signal to the amplifier A. FIG. 7 presents a corresponding circuit implemented using electret films. The charges are on the surface of the folds L, and the opposite sides are provided with porous protective plates 10. FIG. 8 shows a structure in which an electret film (folds L) with a continuous metal plating 11 on one side acts as an element both producing and measuring sound.

It is obvious to a person skilled in the art that different embodiments of the invention are not restricted to the examples described above, but that they may instead be varied within the scope of the following claims.

I claim:

1. Folded dielectric film element for converting energy, comprised of at least one dielectric film bent into folds and provided with electrodes, the electrodes being arranged in the folds, so that different electrodes are placed in successive folds, whereby a strength of an electric field increases in one fold and decreases in a successive fold, wherein the electrodes are arranged in successive folds in the order:

a first d.c. voltage electrode, a first a.c. voltage electrode, a second d.c. voltage electrode having a voltage with opposite sign to the first d.c. voltage electrode, and a second a.c. voltage electrode in opposite phase to the first a.c. voltage electrode, and wherein the a.c. voltages in the a.c. voltage electrodes are used as control voltages for controlling the field strength in successive folds.

2. Folded dielectric film element for converting energy, comprised of at least one dielectric film bent into folds and provided with electrodes, the electrodes being arranged in the folds so that different electrodes are placed in successive folds, whereby a strength of an electric field increases in one fold and decreases in a successive fold, wherein the electrodes are arranged in successive folds in the order:

a first electret charge, a first a.c. voltage electrode, a second electret charge having an opposite charge to the first electret charge and a second a.c. voltage electrode in opposite phase to the first a.c. voltage electrode or zero, and wherein the a.c. voltages in the a.c. voltage electrodes are used as control voltages for controlling the field strength in successive folds.

3. Film element according to claim 1 or claim 2, wherein the dielectric film is provided with a charge, and is coated with electrode layers such that an a.c. voltage electrode, and an a.c. voltage electrode in opposite phase are placed on opposite sides of the respective folds.

4. Film element according to claim 1 or claim 2, wherein the film is coated with at least one protective layer.

5. Film element according to claim 4, wherein the protective layer is a porous protective plate.

6. Film element according to claim 1 or claim 2, wherein the film is provided with a continuous metal plating on one side.

7. Film element according to claim 1 or claim 2, wherein the film is a plastic film containing flat gas bubbles.

8. Film element according to claim 1 or claim 2, wherein, for the production or damping of sound, at least one of the folds is provided with a feedback, and has a sound producing component and a sound measuring component, said components having an electric connection or a variable-gain amplifier between them.

9. Film element according to claim 1 or claim 2, wherein the one fold and the successive fold are separated from each other by a gap.

10. Procedure for manufacturing a folded dielectric film element functioning as an energy converter, and including at least one dielectric film bent into folds and provided with electrodes, comprising:

arranging the electrodes in the folds, by placing different electrodes in successive folds so that a strength of an electric field in adjacent folds increases in one fold and decreases in the other;

compressing the folded element into a tight pack: and stretching the tight pack so that the folds assume a curvature resembling a low-gradient letter S which keeps the folds in a stable position when subjected to the forces of the electric field.

* * * * *